(12) United States Patent
Radens et al.

(10) Patent No.: US 6,437,388 B1
(45) Date of Patent: Aug. 20, 2002

(54) COMPACT TRENCH CAPACITOR MEMORY CELL WITH BODY CONTACT

(75) Inventors: Carl J. Radens, La Grangeville, NY (US); Ulrike Gruening, Munich (DE); Jack A. Mandelman, Stormville, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/866,278

(22) Filed: May 25, 2001

(51) Int. Cl.[7] ................ H01L 27/108; H01L 29/76; H01L 29/94; H01L 31/119
(52) U.S. Cl. ........................... 257/301; 257/302
(58) Field of Search ................ 438/243, 244, 438/253, 386, 387; 257/296, 301, 302

(56) References Cited

U.S. PATENT DOCUMENTS

| | | | | |
|---|---|---|---|---|
| 5,177,576 A | | 1/1993 | Kimura et al. | |
| 5,252,845 A | * | 10/1993 | Kim et al. | 257/302 |
| 5,519,236 A | * | 5/1996 | Ozaki | 257/302 |
| 6,172,390 B1 | * | 1/2001 | Rupp et al. | 257/296 |
| 6,355,529 B2 | * | 3/2002 | Heo et al. | 438/244 |
| 6,365,452 B1 | * | 4/2002 | Perng et al. | 257/301 |
| 6,368,912 B1 | * | 4/2002 | Chang et al. | 438/242 |

* cited by examiner

Primary Examiner—Olik Chaudhuri
Assistant Examiner—Hoai Pham
(74) Attorney, Agent, or Firm—Stanton Braden

(57) ABSTRACT

A semiconductor device includes at least two active areas, each active area surrounding a corresponding trench in a substrate. The trenches each include a capacitor in a lower portion of the trench and a gate in an upper portion of the trench. A vertical transistor is formed adjacent to the trench in the upper portion for charging and discharging the capacitor. A body contact is formed between the at least two active areas. The body contact connects to the at least two active areas and to a diffusion well of the substrate for preventing floating body effects in the vertical transistor.

14 Claims, 5 Drawing Sheets

COMPACT TRENCH CAPACITOR MEMORY CELL WITH BODY CONTACT

BACKGROUND

1. Technical Field

This disclosure relates to semiconductor devices, and more particularly, to a semiconductor device having memory array active areas formed using annular shapes and including body contacts formed between transistor devices and connecting to dopant wells formed in a substrate.

2. Description of the Related Art

Semiconductor memory devices, which include vertical transistors often rely on outdiffusion from buried straps to form a connection between a deep trench storage node and a pass transistor. As shown in FIG. 1, a top view of a partially fabricated dynamic random access memory chip 110 is shown. Four memory cells are depicted; each memory cell includes a deep trench 114. Active areas 116 include diffusion regions. Adjacent to active areas 116 are formed isolation trenches 118 filled with a dielectric material. A buried strap 120 is shown for one of the memory cells 112. A collar 122 of an adjacent cell and two adjacent isolation trenches 118 form a three-sided isolation region encapsulating buried strap 120.

Referring to FIG. 2, a cross-sectional view, taken at section line 2—2 of FIG. 1, is shown. Memory cell 112 includes a vertical transistor 126 employed for accessing a storage node 128 in deep trench 114. When scaling down sizes of memory cells, buried strap 120 outdiffusion regions begin to extend as far as a neighboring memory cell's collar regions 123. Buried strap 120 may form an extended outdiffusion region 130, which may extend to the collar 123 of a neighboring memory cell 121. If contact is made with the neighboring cell's collar 122 by region 130, pinch-off of the access transistor 126 begins to occur. For memory cells which feature vertical access transistors surrounded by a 3-sided isolation, as shown in FIG. 1, floating body effects may arise, similar to those encountered in silicon on insulator structures, if the buried strap's outdiffusion 130 reaches the opposite isolating collar 122 and pinches off the contact to the transistor body.

Floating body effects are caused when the body of a transistor gets electrically isolated from a conductive medium by either an insulator or an area with opposite doping or a depletion region associated with the outdiffusion junction. In silicon on insulator (SOI) transistor structures, an insulator separates two silicon structures, one of which includes a channel region of the transistor device (e.g., transistor body). The potential at the transistor channel cannot be set to a specific value, but changes according to the voltage conditions applied to the adjacent source/drain junctions (i.e., the transistor channel voltage is floating and adjusts thermodynamically to its surroundings). Hence, the transistor threshold voltage changes with varying body bias, leading to parasitic leakage from the transistor. This is undesirable since gate control of the transistor devices is reduced.

Similar effects, as described above with reference to FIGS. 1 and 2, are encountered in vertical transistor structures if the transistor body is disconnected from the silicon substrate by a lower source/drain junction. In other structures, outdiffusion from buried straps on adjacent memory cells may face each other and share a common active area. In these designs, outdiffusion may short storage nodes of adjacent structures. In these designs, isolation regions may be desirable to prevent shorting out these storage nodes; however, this would divide the active area into two portions, cause floating body problems and require additionally processing steps.

Therefore, a need exists for a structure and method for forming a structure, which reduces or eliminates floating body potentials in memory devices with vertical transistors, improves gate control of the vertical transistors, provides compact memory cells and prevents storage node shorts due to outdiffusions of buried straps.

SUMMARY OF THE INVENTION

A semiconductor device includes at least two active areas, each active area surrounding a corresponding trench in a substrate. The trenches each include a capacitor in a lower portion of the trench and a gate in an upper portion of the trench. A vertical transistor is formed adjacent to the trench in the upper portion for charging and discharging the capacitor. A body contact is formed between the at least two active areas. The body contact connects to the at least two active areas and to a diffusion well of the substrate for preventing floating body effects in the vertical transistor.

In other embodiments, the body contact preferably includes doped polysilicon, which outdiffuses into the diffusion well to form a connection to the diffusion well. The semiconductor device may include a dielectric spacer formed along vertical sidewalls of the body contact to prevent electrical connection between the at least two active areas. The body contact may include a doped polysilicon divot spacer formed adjacent to the at least two active areas through the dielectric spacer, and the doped polysilicon divot spacer outdiffuses into the at least two active areas to form a connection to the at least two active areas. Each of the at least two active areas preferably forms an annular ring around the trench. The semiconductor device may include a dielectric layer formed on top of the body contact. A bitline contact may be formed between the gates on the dielectric layer. The bitline contact may connect to at least one of the at least two active areas.

A method for fabricating a semiconductor device includes forming a trench capacitor in a substrate and forming a gate conductor in the trench, which is electrically isolated from the trench capacitor. A first dielectric layer is formed over the gate conductor and portions of the substrate are exposed surrounding the first dielectric layer over the gate conductor. Dopants are implanted in a region surrounding the trench to form an active region around the trench. The active region of the substrate is etched to form a vertical portion. surrounding the trench. A body contact is formed adjacent to the vertical portion which electrically connects the vertical portion to a well formed below the vertical portion in the substrate to prevent floating body effects in a transistor formed by the vertical portion.

In other methods, the step of forming the first dielectric layer may include forming sidewall spacers around sidewalls of the gate conductor after the step of implanting dopants. The step of forming a trench capacitor may include the step of forming trenches in the substrate using a first lithographic mask pattern. The step of implanting dopants may include the step of forming active areas in the substrate using the first lithographic mask pattern to form annular active areas about the trenches. The step forming the body contact may also include forming a dielectric spacer along vertical sidewalls of the body contact. The body contact preferably includes a doped polysilicon divot spacer formed adjacent to the active area through the dielectric spacer.

In still other methods, the step of outdiffusing dopants of the doped polysilicon divot spacer into the active area is preferably performed to form a connection to the active area. The body contact may include doped polysilicon and dopants of the doped polysilicon may be outdiffused into the well to form a connection to the well. A dielectric layer may be formed on top of the body contact and a bitline contact is formed self-aligned between adjacent gates conductor to connect to the active area to a bitline.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides semiconductor structures and methods for formation thereof. The present invention provides body contacts between memory cells of a memory array. Array active areas are advantageously formed using a self-aligned annulus of active area surrounding a deep trench. The deep trench includes a storage node for storing charge (e.g., a deep trench capacitor). A body contact is provided between memory cells and connects to a well (e.g., a p-well) in between devices using divot fill process.

In preferred embodiments of the present invention, vertical trench sidewall array devices are employed with buried straps for connecting a storage node to an active area. The array active area is formed using a deep trench pattern to form self-aligned annular rings around the deep trenches. Array gate oxidation and isolation trenches (IT) may be separately formed from support devices in a support region. A body contact is preferably formed for transistor devices using a conductive (polysilicon) fill and additional buried strap formations between trenches. The body contact preferably includes a high-resistance to a p-well formed in a substrate of the semiconductor device to eliminate floating body effects.

Wordline formation is preferably de-coupled from support devices (or optional damascene gate support devices). The periphery region of a chip includes support devices, which are formed away from the memory array. The support device transistors are advantageously fabricated and optimized separate from the memory array devices. Block masks may be used to delineate support regions during memory array processing. Bitline contacts are self-aligned to adjacent wordlines wordline, and may be shared between cells.

The present invention will be described in terms of illustrative examples to explain the present invention. The present invention should not be construed as limited to the illustrative examples and may be employed with other structures or process steps, for example, device conductivities may be switched (e.g., p-regions may be switched to n-regions and vice versa), as would be understood by one skilled in the art.

Figure 3:
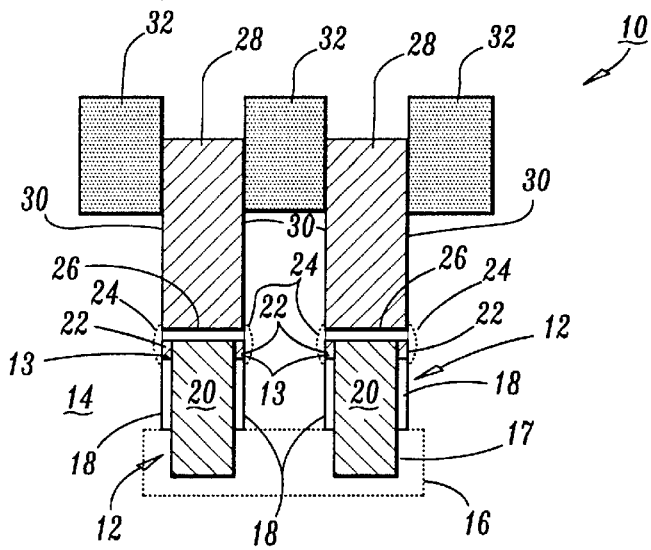
FIG. 3 is a cross-sectional view of a semiconductor device of the present invention showing a trench capacitor and a gate conductor (wordline) formed in a trench.

Referring now in specific detail to the drawings in which like reference numerals identify similar or identical elements throughout the several views, and initially to FIG. 3, a cross-sectional view of a semiconductor device 10 is shown in accordance with an embodiment of the present invention. Semiconductor device 10 may include a memory device, such as a dynamic random access memory (DRAM) device, although other semiconductor devices may employ the present invention as well. Deep trenches 12 are etched into a substrate 14 by anisotropic etching processes, such as reactive ion etching (RIE) or other known process. Substrate 14 may include a monocrystalline silicon material, although other suitable substrate materials may be employed. A buried plate 16 is formed at lower portions of trenches 12, which function as a capacitor plate of the deep trench capacitors 11 (FIG. 13) which will be formed in trenches 12. In this embodiment, buried plate 16 includes n+ dopants, although dopant conductivity types may be modified as understood by one skilled in the art.

Trenches 12 includes a collar 18, preferably silicon oxide, and a node dielectric 17, preferably silicon nitride which lines trench 12 to act as a capacitor dielectric at the lower portion of trench 12. A storage node 20 fills trench 12 and preferably includes polysilicon material. A buried strap region 22 is formed inside trenches 12 and provides an outdiffusion region 24 when dopants of buried strap region 22 outdiffuse into substrate 14.

A trench top dielectric 26 preferably includes an oxide layer called a trench top oxide (TTO). TTO 26 separates a gate electrode conductor 28 from buried strap 22 and storage node 20. A gate oxide layer 30 is formed preferably by a thermal oxidation process on surfaces of substrate 14 prior to the deposition of gate conductor 28. Array gate oxide layer 30 is formed in a different process than gate oxide in support devices in a support region (not shown). Gate conductor 28 preferably includes polysilicon although other conductive materials may be employed in addition to or instead of polysilicon, for example metal silicides. A pad dielectric layer 32 is employed (which may include a pad oxide layer with a pad nitride layer formed on the pad oxide layer) in protecting surfaces of substrate 14 and for providing a layer against which etch masks for etching trenches 12 may be removed. Also, pad dielectric layer 32 may be employed as a polish stop layer to form caps 34 as will be described with reference to FIG. 4.

Pad dielectric layer 32 also provides an etch mask employed in recessing gate conductor 28 to a level below the surface of pad dielectric layer 32. Recessing of gate conductor 28 may be performed by an anisotropic etching process.

Figure 4:
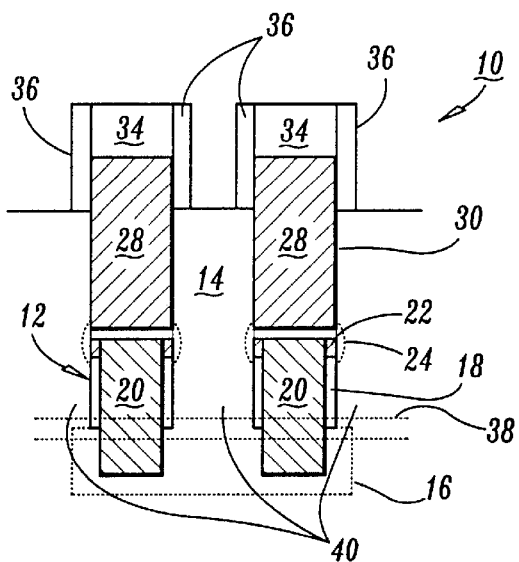
FIG. 4 is a cross-sectional view of the semiconductor device of FIG. 3 showing a cap deposited and planarized followed by active area implantation to form active areas around the trenches and a spacer dielectric formed on sidewalls of the gate conductor in accordance with the present invention.

Referring to FIG. 4, a dielectric layer is deposited on the structures of FIG. 3 and planarized to form caps 34. Caps 34 preferably include an oxide or other dielectric material, which permits the selective removal of pad dielectric layer 32 (e.g., the silicon nitride portion of dielectric layer 32). Pad dielectric layer 32 is then selectively stripped from the surface of substrate 14. A sacrificial oxide (not shown) may be performed to prevent surface damage during ion implantation processes. Ion implantation is employed to form a doped band (e.g., n-band) 38 in substrate 14 which electrically connects buried plates 16. A well region 40 above band 38 is also formed which includes a well of opposite conductivity to band 38 and buried plates 16 (e.g., a p-well). Device implantation is performed to provide active areas in substrate 14 for vertical transistors, which are formed in later steps. Advantageously, active area formation is performed by employing a same lithographic mask as employed for etching trenches 12. In this way, annular active area region 90 (FIG. 14) are formed about trenches 12. Annular regions 90 may form a circular ring, an acircular ring (e.g., an oval) or a rectangular shape active area with a different shaped deep trench 12.

An isolation trench mask dielectric layer is formed by depositing a dielectric layer over caps 34 and substrate 14. The dielectric layer is then etched in a spacer etch process (e.g., RIE) to form isolation trench mask spacers 36, which takes an annular shape about trench 12. Isolation trench mask 36 preferably includes the same material as caps 34 (e.g., an oxide).

In an alternate embodiment, pad dielectric 32 may be laterally etched back followed by ion implantation of device diffusion regions. Then, the simultaneous formation of isolation trench mask 36 and cap 34 may be performed by deposition and planarization of, for example, of an oxide dielectric material. Next, pad dielectric 32 is stripped.

Figure 5:
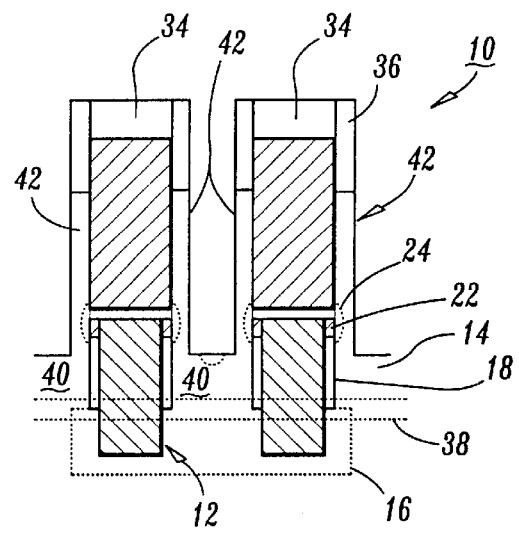
FIG. 5 is a cross-sectional view of the semiconductor device of FIG. 4 showing an isolation trench (IT) etch self-aligned to the trench gate caps and spacer dielectric and showing active areas, each forming a self-aligned annulus around each trench in accordance with the present invention.

Referring to FIG. 5, substrate 14 is etched by an anisotropic etch process which is advantageously self-aligned to trenches 12 since caps 34 and spacers of isolation trench mask 36 are employed as an etch mask. Etching substrate 14 leaves vertical portions 42, which will form a device body for vertical transistors, which are to be formed in this region. Since outdiffusion regions 24 of buried straps 22 may extend across vertical portions 42, a body contact is advantageously employed to prevent pinch-off and floating body effects (parasitic leakage and loss of gate control). Body contact formation is described with reference to FIG. 6.

Figure 6:
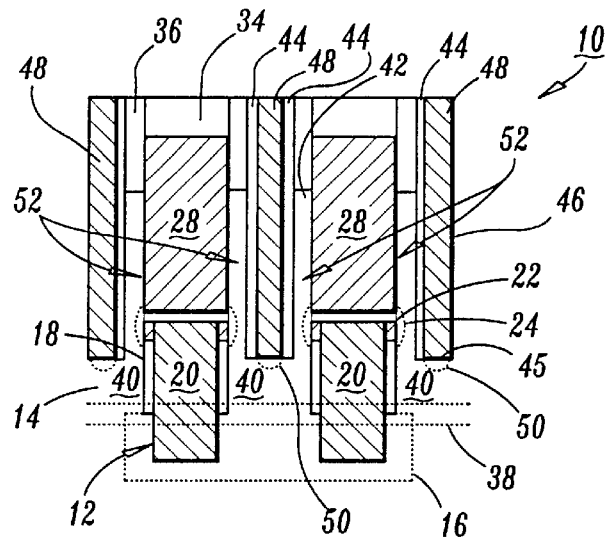
FIG. 6 is a cross-sectional view of the semiconductor device of FIG. 5 showing a body contact spacer and a body contact formed, the body contact including an outdiffusion region to provide a better connection to a diffusion well in accordance with the present invention.

Referring to FIG. 6, a body contact sidewall spacer 44 is deposited over exposed surface of device 10. Spacer 44 preferably includes a silicon nitride layer or other dielectric layer, which is selectively removable relative to isolation mask spacer 36, cap 34 and substrate 14. Spacer 44 functions as a shallow trench isolation (STI) region to separate devices. Advantageously, isolation trenches (IT) in the support region (not shown) are formed in a separate process.

An anisotropic etch is performed to remove spacer 44 from top portions of caps 34 and spacers 36 and from the bottom 45 of each body contact trench 46. Body contact trenches 46 are filled with a conductive material, for example, doped polysilicon, to form body contacts 48 to p-well to eliminate floating body effects. A top surface of device 10 is planarized by, for example, a chemical-mechanical polishing (CMP) process. Dopants from poly-silicon of body contacts 48 outdiffuse (e.g., p-type dopants) into regions 50 to form a good electrical connection between substrate 14 and body contacts 48. The connection at region 50 is to well region 40 (e.g., p-well) in an area below transistor channel regions of vertical transistors 52.

Figure 1:
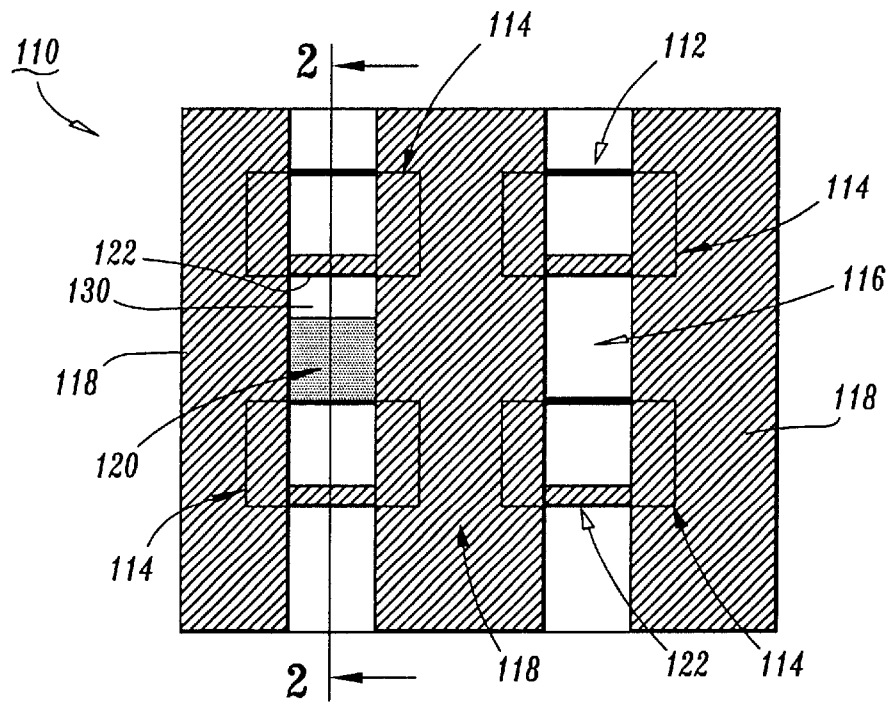
FIG. 1 is a top layout view of a prior art semiconductor memory showing a buried strap with dopant outdiffusion.
Figure 7:
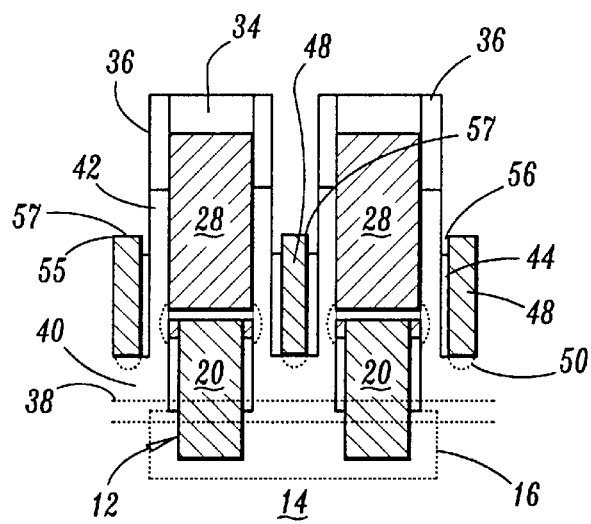
FIG. 7 is a cross-sectional view of the semiconductor device of FIG. 6 showing a body contact recess, body contact spacer etch and overetch to recess a divot in accordance with the present invention.

Referring to FIG. 7, body contacts 48 are recessed below a top surface of vertical portions 42. Then, body contact spacer 44 is recessed to below a top surface 55 of recessed body contacts 48. This exposes a portion 56 of sides of body contacts 48. Exposed portions 55 and 56 are subject to a nitridation process, preferably a thermal nitridation to form a thin layer 57 of nitride as a diffusion barrier to body contact 48 and to provide for the selective removal of a divot strap material from the nitride layer 57. It should be understood that a similar nitridation process is performed between a divot strap portion 13 and node 20 of FIG. 1 to form a diffusion barrier and to provide for the selective removal of a divot strap material from a nitride layer (not shown) formed on node 20.

Figure 8:
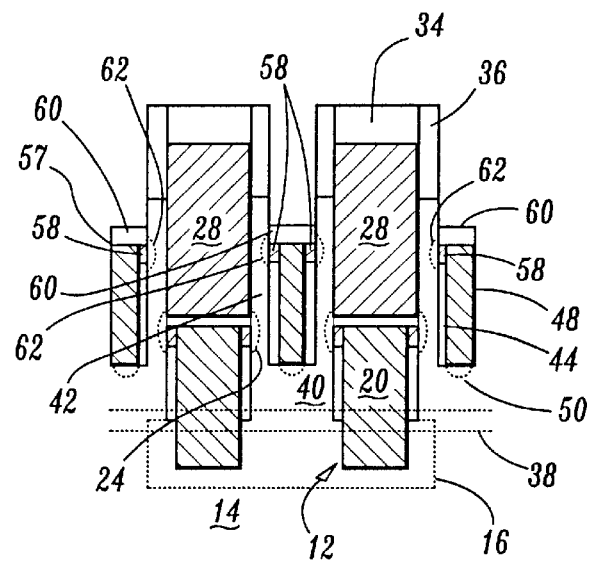
FIG. 8 is a cross-sectional view of the semiconductor device of FIG. 7 showing the body contact thin strap polysilicon deposition and etchback (divot fill strap), the divot fill strap outdiffuses dopants to form body contact connections, and a trench-top oxide (TTO) is formed in accordance with the present invention.

Referring to FIG. 8, a body contact divot strap 58 is formed by depositing, for example, a highly doped polysilicon material, preferably by a low pressure chemical vapor deposition process (LPCVD), and then, etching the polysilicon back to nitride layer 57. This removes polysilicon form other surface and leaves body contact divot strap 58 remaining in divots formed between body contacts 48 and substrate 14. A trench top dielectric, preferably a trench top oxide (TTO) 60 is formed over body contacts 48. TTO 60 is preferably formed by an anisotropic deposition process so that oxide is not formed on vertical surfaces. For example, a high density plasma deposition (HDP) may be used to anisotropically form TTO 60 (as well as TTO 26 in FIG. 3).

It is to be understood that body contact divot strap 58 outdiffuses (e.g., p-type dopants) to form outdiffusion regions 62. In this way, a conductive path exists between vertical portions 42 and well 40. This conductive path of body contacts 48 bypasses outdiffusion region 24, which elimination transistor pinch off and floating body effects caused thereby. Further, since floating body effects are eliminated better gate control of vertical transistors is achieved.

Figure 9:
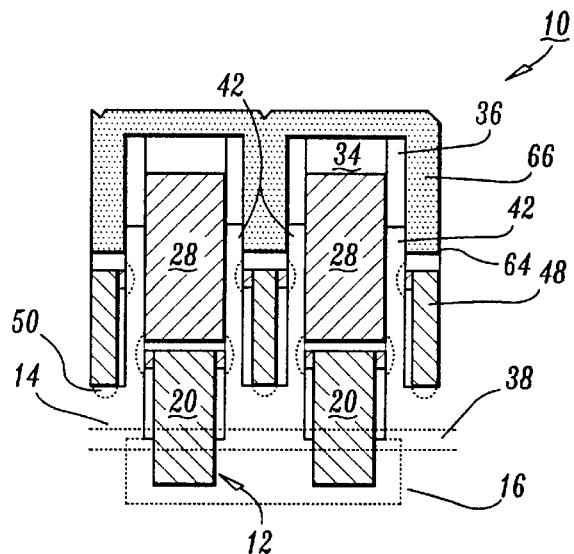
FIG. 9 is a cross-sectional view of the semiconductor device of FIG. 8 showing a liner deposition and dielectric deposition over the semiconductor device in accordance with the present invention.

Referring to FIG. 9, a liner 64 is deposited over surfaces of device 10. Liner 64 preferably includes an oxide and is employed to protect surfaces of substrate 14 at vertical portions 42. A dielectric layer 66 is deposited over device 10. Dielectric layer 66 preferably includes silicon nitride so that portion of layer 66 can be removed selective to liner 64, cap 34 and spacers 36. Dielectric layer 66 may be planarized.

Figure 10:
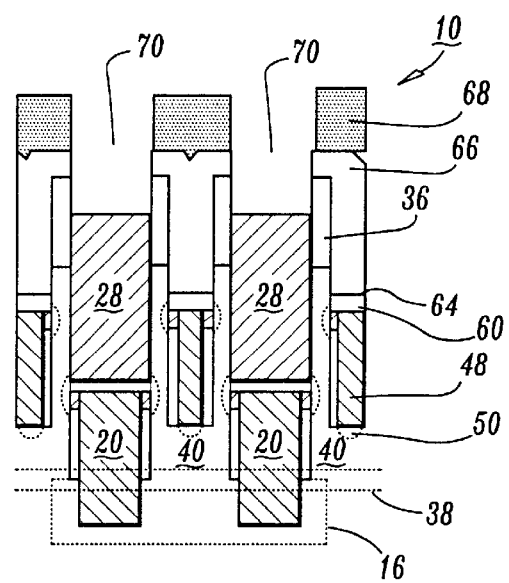
FIG. 10 is a cross-sectional view of the semiconductor device of FIG. 9 showing a wordline pattern etched into the dielectric layer formed in FIG. 9 and a trench gate cap etched in accordance with the present invention.

Referring to FIG. 10, a resist layer 68 is spun onto device 10 and lithographically patterned to open holes 70 over wordlines (gate conductors 28). The wordline pattern is etched down through dielectric layer 66 and cap 34. Resist layer 68 is then removed.

Figure 11:
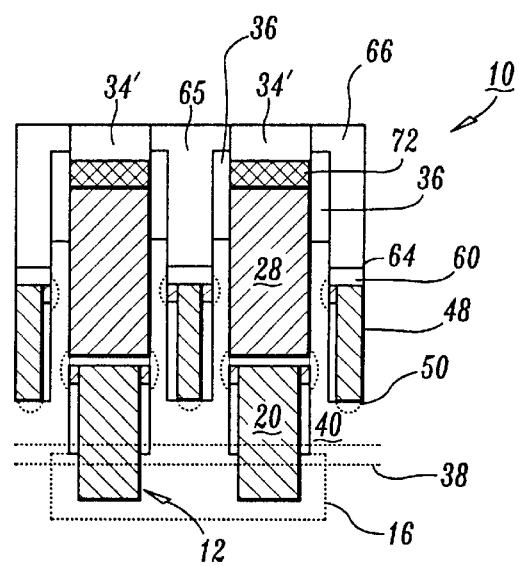
FIG. 11 is a cross-sectional view of the semiconductor device of FIG. 10 showing a wordline conductor deposited and recessed and a cap deposition and planarization in accordance with the present invention.

Referring to FIG. 11, a wordline conductor material deposition is performed. Then, the wordline conductor material is recessed below a top surface of spacers 36 to form a wordline conductor 72. Wordline conductor 72 preferably includes a more conductive material than gate conductor 28, for example, tungsten silicide or other metals and/or their silicides. A new cap 34' is formed by depositing a dielectric, for example, a silicon oxide and planarizing the dielectric.

Figure 12:
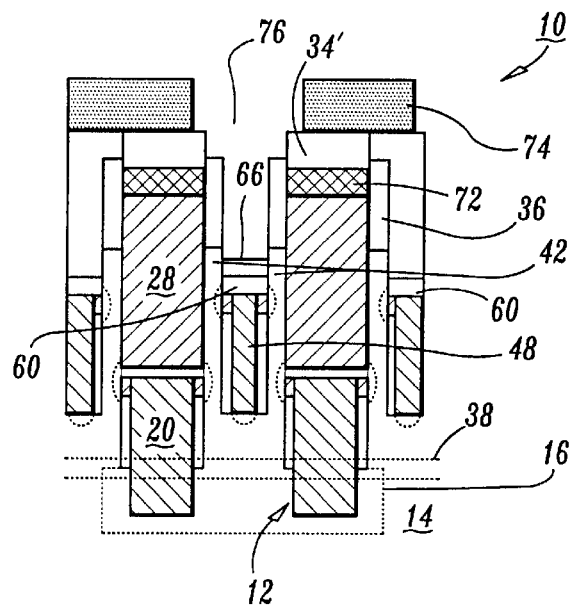
FIG. 12 is a cross-sectional view of the semiconductor device of FIG. 11 showing a diffusion contact (bitline contact) hole self-aligned to wordlines in accordance with the present invention.

Referring to FIG. 12, a resist layer 74 is spun onto device 10 and lithographically patterned to open up an area over body contact 48 in locations over active areas (vertical portions 42) where bitline or diffusion contacts are to be formed. Dielectric layer 66 is removed selective to liner 64 and spacers 36 and cap 34'. A hole 76 for a bitline contact 78 (FIG. 13) is advantageously self-aligned between caps 34' of adjacent memory cells. A portion of dielectric layer 66 may be left over TTO 60. However, contact 78 (FIG. 13) is to be connected to substrate 14 at vertical portions 42.

Figure 13:
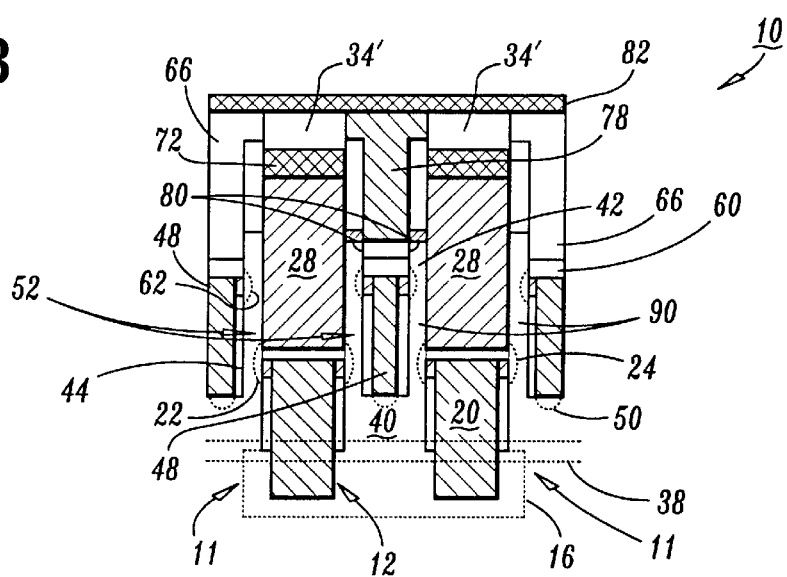
FIG. 13 is a cross-sectional view of the semiconductor device of FIG. 12 showing a bitline contact and a bitline formed in accordance with the present invention.

Referring to FIG. 13, bitline contact 78 is formed by depositing a conductive material in hole 78. Conductive material of bitline contact 78 preferably includes an n-type doped low-pressure deposited polysilicon material. outdiffusion regions 80 (e.g., n-type dopants) form in vertical portions 42 and improve the electrical connection between contact 78 and vertical portions 42.

FIGS. 12 and 13 show an embodiment where a single bitline contact 78 connects to two adjacent memory cells. In other embodiments, contacts (78) may be formed for each memory cell by leaving a dielectric material to prevent an electrical connection on one side of contact 78, or by recessing one vertical portion 60 below dielectric layer 66 during earlier processing steps.

Figure 2:
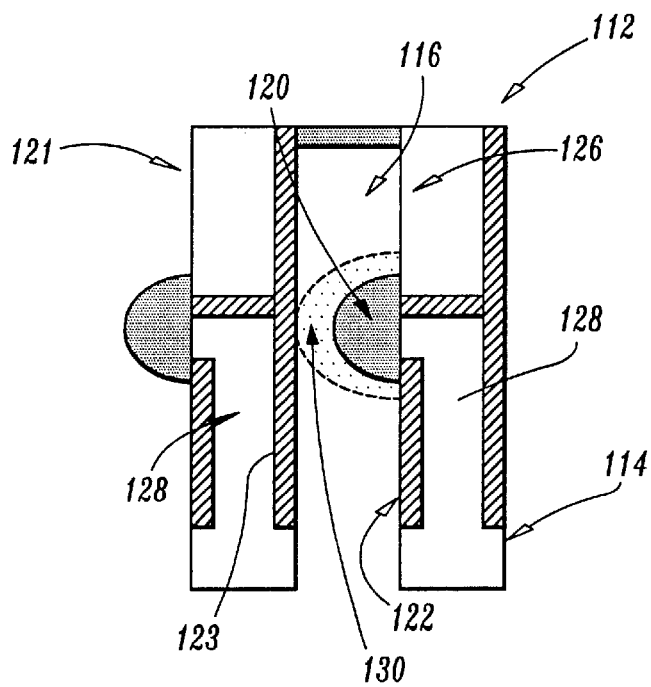
FIG. 2 is a cross-sectional view, taken at section line 2—2, of a prior art semiconductor memory showing pinch off due to the buried strap dopant outdiffusion causing floating body effects.

Device 10 is planarized, by e.g., CMP, and a bitline 82 is formed, which connects to contacts 78. Processing continues by depositing dielectric layers and higher metallization layers to complete device 10. Body contacts 48 of the present invention may be employed in other architectures. For example, a single sided buried strap e.g., in the architecture of FIGS. 1 and 2, may employ body contacts 48 in accordance with the present invention.

Figure 14:
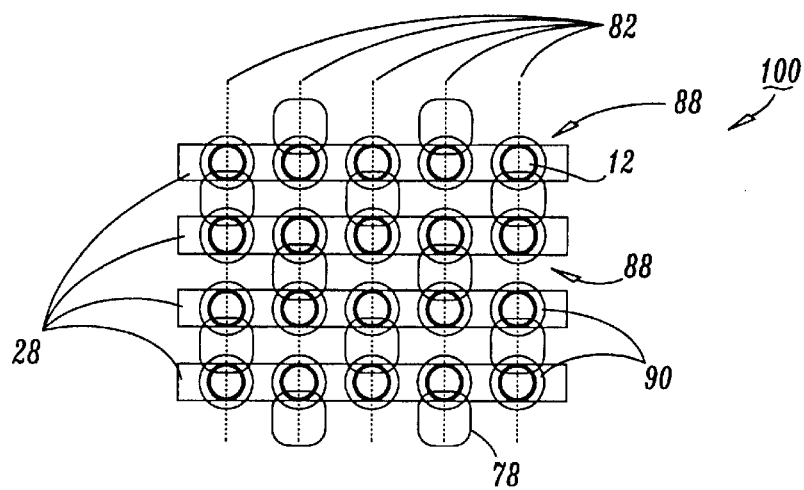
FIG. 14 is an illustrative layout of the semiconductor device in accordance with the present invention.

Referring to FIG. 14, an illustrative layout 100 is shown for device 10. Layout 100 includes a plurality of memory cells 88. Each memory cell of layout 100 includes a cell area of $4F^2$ where F is a groundrule dimension (e.g., a minimum feature size). Bitlines 82 are shown as dotted lines so that the view of underlying features is not obscured. Wordlines 28 are oriented perpendicularly relative to bitlines 82. Trenches 12 are directly below and in line with wordlines 24. Annular active area regions 90 (vertical portions 42) surround trenches 12. Bitline contacts 78 are formed between adjacent memory cells 88 in an alternating pattern such that two cells are serviced by one bitline contact 78. Body contacts 48 (not shown) are formed below contacts 78. Similar layouts and variations of layout 100 are contemplated for the present invention. Cell layout areas of less than or equal to $5F^2$ are preferred. F may be, for example, 0.13 microns or less. In other embodiments, bitline and/or wordline pitch may be adjusted, and/or bitline contacts may be placed on every cell.

Having described preferred embodiments for compact trench capacitor memory cell with body contact (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor device, comprising:
   at least two active areas, each active area surrounding a corresponding trench in a substrate;
   the trenches each including a capacitor in a lower portion of the trench and a gate in an upper portion of the trench such that a vertical transistor is formed adjacent to the trench in the upper portion for charging and discharging the capacitor; and
   a body contact formed between the at least two active areas, the body contact connecting to the at least two active areas and to a diffusion well of the substrate for preventing floating body effects in the vertical transistor.

2. The semiconductor device as recited in claim 1, wherein the body contact includes doped polysilicon which outdiffuses into the diffusion well to form a connection to the diffusion well.

3. The semiconductor device as recited in claim 1, further comprising a dielectric spacer formed along vertical sidewalls of the body contact to prevent electrical connection between the at least two active areas.

4. The semiconductor device as recited in claim 3, wherein the body contact includes a doped polysilicon divot spacer formed adjacent to the at least two active areas through the dielectric spacer, the doped polysilicon divot spacer outdiffuses into the at least two active areas to form a connection to the at least two active areas.

5. The semiconductor device as recited in claim 1, wherein each of the at least two active areas forms an annular ring around the trench.

6. The semiconductor device as recited in claim 1, further comprising a dielectric layer formed on top of the body contact.

7. The semiconductor device as recited in claim 6, further comprising a bitline contact formed between the gates on the dielectric layer, the bitline contact connecting to at least one of the at least two active areas.

8. A semiconductor device, comprising:
   a plurality of memory cells, each memory cell including:
      a trench formed in a substrate, the trench having a storage node formed therein and a buried plate surrounding a portion of the trench, the buried plate and the storage node being separated by a node dielectric layer to form a capacitor;
      an annular active area formed in the substrate and surrounding the trench to form a vertical transistor;

a body contact formed adjacent to the annular active area, the body contact connecting a well formed in the substrate to the annular active area for preventing floating body effects in the vertical transistor.

9. The semiconductor device as recited in claim 8, wherein the body contact includes doped polysilicon which outdiffuses into the diffusion well to form a connection to the diffusion well.

10. The semiconductor device as recited in claim 8, further comprising a dielectric spacer formed along vertical sidewalls of the body contact to prevent electrical connection between two adjacent active areas.

11. The semiconductor device as recited in claim 10, wherein the body contact includes a doped polysilicon divot spacer formed adjacent to the active area through the dielectric spacer, the doped polysilicon divot spacer outdiffuses into the active area to form a connection to the active area.

12. The semiconductor device as recited in claim 9, further comprising a dielectric layer formed on top of the body contact.

13. The semiconductor device as recited in claim 12, further comprising a bitline contact formed between the gates on the dielectric layer, the bitline contact connecting to the active area.

14. The semiconductor device as recited in claim 8, wherein each memory cell occupies an area of less than or equal to $5F^2$ where F is a groundrule dimension.

* * * * *